United States Patent [19]
Adam

[11] 3,983,409
[45] Sept. 28, 1976

[54] BUCKET-BRIGADE CIRCUIT

[75] Inventor: Fritz Gunter Adam, Freiburg, Germany

[73] Assignee: ITT Industries, Inc., New York, N.Y.

[22] Filed: Mar. 27, 1974

[21] Appl. No.: 455,438

[30] Foreign Application Priority Data
Apr. 6, 1973  Germany............................ 2317252
July 14, 1973  Germany............................ 2335989

[52] U.S. Cl............................. 307/221 D; 307/264; 328/162; 328/172; 357/24
[51] Int. Cl.²................... G11C 19/28; H03K 23/02
[58] Field of Search .......... 307/221 D, 264; 357/24; 328/162, 163, 172, 173, 175

[56] References Cited
UNITED STATES PATENTS
3,546,490  12/1970  Sangster.......................... 307/221 D
3,737,683  6/1973  Sangster.......................... 307/221 D Primary Examiner—John Zazworsky
Attorney, Agent, or Firm—John T. O'Halloran; Peter Van Der Sluys; Vincent Ingrassia

[57] ABSTRACT

This invention relates to a bucket brigade circuit or delay line having a compensation circuit for the loss of the dc level after n stages. The compensation circuit contains a differential amplifer and a transferring circuit adding the dc level loss to the bucket brigade line dc level. The differential amplifier samples the signals of a line stage close to the input and a line stage far from the input which are both controlled by the same signal phase.

14 Claims, 6 Drawing Figures

BUCKET-BRIGADE CIRCUIT

BACKGROUND OF THE DISCLOSURE

This invention relates to bucket-brigade circuits of the type described in "IEEE Journal of Solid-State Circuits," June 1969, pp. 131 to 136. Such bucket-brigade circuits comprise a plurality of stages which are all of the same kind, and of which each consists of a transistor and a capacitor arranged between the gate and the drain terminal thereof, and which are in such a way connected in series that the drain terminal of one is connected to the source terminal of the following transistor. The gate terminals of the even-numbered transistors are controlled by a first square-wave clock signal, and the gate terminals of the odd-numbered transistors are controlled by a second square-wave clock signal of the same frequency whose effective pulses fall within the intervals of the effective pulses of the first clock signal. Such bucket-brigade circuits are also referred to as shift registers or delay lines for analog signals.

A problem arises in connection with such bucket-brigade circuits in that the d.c. voltage level drifts along the bucket-brigade circuit towards higher or lower values. This d.c. voltage is composed of the d.c. voltage applied to the input of the bucket-brigade circuit and which is superimposed by the signal to be delayed, and of the d.c. component of the signal to be delayed. This drift of the d.c. voltage level in the case of bucket-brigade circuits composed of insulated-gate field-effect transistors (IGFETs), for example, is due to the fact that at low clock frequencies, a drifting of the d.c. potential in the direction towards the substrate potential is effected by the reverse current of the diffused zones while on the other hand, at high clock frequencies, the d.c. voltage level drifts in the opposite direction owing to the surface states. In bucket-brigade circuits composed of bipolar transistors, the base current of the transistors is responsible for having an effect upon the d.c. voltage level corresponding to the last-mentioned effect. In accordance with the aforementioned technical publication, level-regenerating circuits have been used to overcome the drift problem, however these circuits result in amplification of the signal to be delayed. An application of this conventional principle to bucket-brigade circuits composed of IGFETS, moreover, only permits compensation of the effect caused by the surface states while the drifting of the d.c. voltage level towards the substrate potential cannot be avoided with the aid of the conventional circuit.

SUMMARY OF THE INVENTION

It is the object of the invention to provide an improved d.c. voltage compensation circuit for bucket-brigade circuits which, especially in the case of bucket-brigade circuits composed of IGFETs, restores the drifted d.c. voltage level. Morever, the level correction or regeneration circuit automatically re-establishes the original d.c. voltage level in a self-regulating manner.

According to a broad aspect of the invention there is provided "Claim 1" a plurality of stages which are all of the same kind, each consisting of a transistor and a capacitor coupled between the gate and drain terminal thereof, and coupled together such that the drain terminal of each transistor is connected to the source terminal of the next successive transistor, wherein the gate terminals of even numbered transistors are controlled by a first squarewave clock signal and the gate terminals of odd numbered transistors are controlled by a second squarewave clock signal of the same frequency effective pulses lying in the intervals between effective pulses of said first clock signal comprising a differential ammplifier (DV1) having first and second inputs, said first input coupled to the drain of a first transistor (Tm) near the input of said bucket-brigade circuit and said second input coupled to the drain terminal of a second transistor (Tn) far from the input of said bucket-brigade circuit, said first and second transistors controlled by the same clock signal, said differential amplifier having first and second outputs, said first output coupled to the drain terminal of one of the transistors preceding said first transistor for applying a compensating signal. The above and other objects of the present invention will be more clearly understood from the following detailed description taken in conjunction.

DESCRIPTION OF THE PREFERRED EMBODIMENTS

Figure 1:
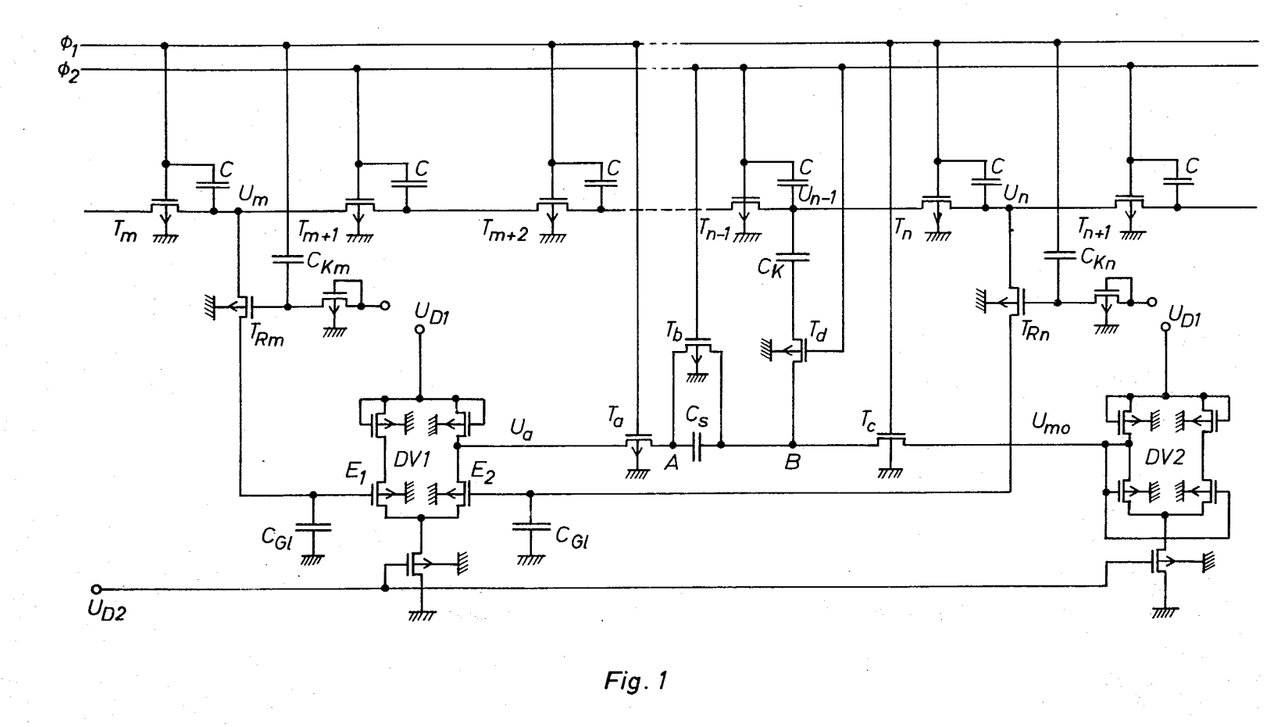
FIG. 1 is a first embodiment of the invention bucket-brigade circuit.

FIG. 1 shows a first embodiment of the inventive bucket-brigade circuit. In the upper half of FIG. 1 there are shown some stages of a conventional bucket-brigade circuit consisting of p-channel IGFETs, which in some of transistors, are indicated by the arrowhead on the substrate junction connected to the zero point of the circuit. Of course, it is also possible to use n-channel IGFETs as well as bipolar pnp-or npn-type transistors. With respect to IGFETs, it is possible to use depletion-type IGFETs as well as enhancement-type IGFETs. Of the entire bucket-brigade circuit which, as is well known, may be in the order of some hundred stages, with the number of stages being dependent upon the intended delay time and the maximum signal frequency to be transmitted, there are shown in FIG. 1 the transistors $T_m$, $T_{m+1}$, $T_{m+2}$, $T_{n-1}$, $T_n$ and $T_{n+1}$. These transistors are interconnected and arranged in series with the associated capacitors C in the manner described hereinbefore. The gate electrodes of the even-numbered transistors $T_m$, $T_{m+2}$ and $T_n$ are applied to the first clock signal $\phi_1$ and the gate electrodes of odd-numbered transistors $T_{m+1}$, $T_{n-1}$ and $T_{n-1}$ are applied to the second clock signal $\phi_2$.

Each of the clock signals $\phi_1$ and $\phi_2$ consist of a square-wave equal-frequency voltage, which is referenced to the zero point of the circuit. The amplitude of the one clock signal lies in the interval between the effective pulses of the other clock signal, and vice versa. Relative thereto, each of the clock signals may have a pulse duty factor of 0.5, but it is also possible to choose a pulse duty factor varying in such a way from the aforementioned pulse duty factor that intervals will appear between the effective pulses of the two clock signals, during which both clock signals equal zero.

As is well known, a bucket brigade circuit of the type mentioned hereinbefore, operates such that every second stage, hence every odd or every even-numbered stage, will contain signal information in the form of a quantity of charge stored in the associated capacitor C, at the end of a clock pulse, while the capacitors of the stages lying inbetween are discharged and, accordingly, do not contain any information.

The principles of regenerating the d.c. voltage level or of keeping constant the input d.c. voltage level respectively reside in applying the signal information, namely the potentials of a stage close to and far from the input of the bucket-brigade circuit, after correspondingly suppressing the signal components, to two inputs of a differential amplifier, and to re-apply the output signal thereof in the proper phase position to one of the transistors preceding the transistor far from the input of the bucket-brigade circuit.

In the embodiment according to FIG. 1 this transistor preceding the transistor $T_n$ far from the input of the bucket-brigade circuit, is the immediate preceding transistor $T_{n-1}$. As the transistor $T_m$ close to the input, there is preferably chosen the first delaying transistor of the bucket-brigade circuit at whose drain terminal the d.c. potential still has full rated value for optimum control of the bucket-brigade circuit. The signals taken off at the drain terminals of the two transistors $T_m$ and $T_n$ are respectively applied to the two inputs $E_1$ and $E_2$ of the differential amplifier DV1 across the additional transistors $T_{Rm}$ and $T_{Rn}$ which are interconnected as high-ohmic resistors.

These two additional transistors $T_{Rm}$ and $T_{Rn}$, in the known manner, are connected as high-ohmic resistors. Their gate terminals, via a reverse-biased diode (via the IGFET connected as a diode) is applied to a suitable operating voltage; e.g. to the operating voltage $U_{D1}$ of the differential amplifier DV1. Moreover, the two inputs are respectively connected via the capacitor $C_G$ to the zero point of the circuit, with the resistance value of the additional transistor $T_{Rm}$ or $T_{Rn}$ and the capacitance of the filter capacitor chosen such that the RC-combination will act as a low-pass filter for the signal frequencies of the bucket-brigade circuit to be delayed. When realizing the bucket-brigade circuit in an integrated form, the filter capacitors will not be capable of being integrated due to their considerable space requirement, so that they will have to be externally connected.

The two transistors $T_m$ and $T_n$ from which the input signals for the differential amplifier DV1 are taken, are both even-numbered transistors controlled by the same clock signal $\phi_1$, thus safeguarding that the two stages are always in the same state. Of course, it is also possible to use two odd-numbered stages for taking off the input signals of the differential amplifier DV1, which would then be connected to the clock signal $\phi_2$.

Depending on how the gate electrodes of the additional transistors $T_{Rm}$ and $T_{Rn}$ are controlled, it is possible to generate at the inputs of the differential amplifier either the average d.c. potential as averaged over all time intervals, or the average d.c. potential averaged only over the drain terminal-clock periods of the transistors $T_m$, $T_n$. Naturally, the last-mentioned averaged d.c. voltage potential is higher than the average d.c. voltage potential as averaged over all time periods and is thus, under certain circumstances, more suitable for controlling the amplifier transistors of the differential amplifier DV1. The last-mentioned possibility is indicated in FIG. 1 where the gate terminals of the transistors $T_{Rm}$ and $T_{Rn}$ are connected via the coupling capacitors $C_{Km}$ and $C_{Kn}$ to the first clock signal, hence to that particular clock signal to which the tapped transistors $T_m$ and $T_n$ are applied. In this way the respective drain potentials of the transistors $T_m$ and $T_n$ are applied via the unblocked transistors $T_{Rm}$ and $T_{Rn}$ to the inputs of the differential amplifier while the corresponding source potential are kept away from the differential amplifier inputs by means of the transistors $T_{Rm}$ and $T_{Rn}$ which are then blocked or rendered non-conductive.

In the example of embodiment according to FIG. 1 the output signal of the differential amplifier DV1 is capacitively fed to the drain of transistor $T_{n-1}$ directly preceding the transistor $T_n$ which is far from the input of the bucket-brigade circuit, after having been subjected to a time delay by half the time required for one period of the clock signals, hence in proper phase relation. In so doing, there is used the particular one of the two output signals of the differential amplifier DV1 which is inverted with respect to the drain potential difference $U_n-U_m$ between the transistor $T_n$ far from the input of the bucket-brigade circuit and the transistor $T_m$ close to the input of the bucket-brigade circuit. This inverted output of the differential amplifier DV1 is connected via the series arrangement consisting of the source-drain path of the third additional transistor $T_a$, of the storage capacitor $C_s$, and the source drain path of the fourth additional transistor $T_c$, to one of the outputs of the additional differential amplifier DV2, the two inputs of which being applied to one of its two outputs. The storage capacitors $C_s$ is bridged by the source drain path of the fifth additional transistor $T_b$. Point B, connecting the storage capacitor and the source of the fourth additional transistor $T_c$, is connected via the series arrangement consisting of the source drain path of the sixth additional transistor $T_d$ and of the third coupling capacitor $C_k$, to the drain terminal of transistor $T_{n-1}$ directly preceding the transistor $T_n$. In the course of this the additional transistors $T_a$ and $T_c$ are operated by the clock signal of the tapped transistors $T_m$ and $T_n$, hence by the clock signal $\phi_1$ while the additional transistors $T_b$ and $T_d$ are operated by the other one of the two clock signals, hence by the clock signal $\phi_2$.

Both the differential amplifier DV1 and the additional differential amplifier DV2 are of identical design and each consists of two amplifier transistors and of two transistors connected as load impedances, which are applied in common to the operating voltage $U_{D1}$. The source terminals of the two amplifier transistors are each connected jointly via a constant current transistor to the zero point of the circuit while the gate terminal of the constant current transistor is connected to the constant voltage $U_{D2}$. Accordingly, these differential amplifiers are of conventional design.

In an ideal bucket-brigade circuit the two input potentials of the differential amplifier DV1 would be alike, because in the ideal circuit the d.c. potentials do not vary along the line of the bucket-brigade circuit stages. The potential appearing at the outputs of the differential amplifier DV1 is the same with respect to both outputs and is referred to as $U_{mo}$ in the following consideration. This zero potential is continuously provided for by a second differential amplifier of identical design, namely DV2 at its output which is connected to the two inputs thereof.

In cases where the d.c. potentials $U_m$, $U_n$ of the drain potentials of the transistors $T_m$ and $T_n$ differ from one another, the following potential will be applied to the output which is inverted with respect to the potential difference $U_n - U_m$:

$$U_a(t_1) = U_{mo} - \beta(U_n - U_m)$$

wherein $\beta$ indicates the gain of the differential amplifier DV1 as referred to the respective output.

Via the two additional transistors $T_a$ and $T_c$ rendered conductive by the first clock signal $\phi_1$, the output potential $U_a$ is now applied from the output of the differential amplifier DV1, and the output potential $U_{mo}$ is applied from the output of the differential amplifier DV2 each to one electrode of the capacitor $C_s$ which, in comparison with the other capacitances of the circuit, has a relatively high capacitance. During the half period of the clock signal during which the storage capacitor $C_s$ is charged, the additional transistors $T_b$ and $T_d$ are blocked since $T_b$ and $T_d$ are rendered non-conductive by the other clock signal $\phi_2$. During the next half period of the clock signal the additional transistors $T_b$ and $T_d$ are rendered conductive after the additional transistors $T_a$ and $T_c$ have been blocked. Thus, via the additional transistor $T_d$, point B connecting the storage capacitor $C_s$ and the additional transistor $T_c$, is connected to the coupling capacitor $C_K$ whose capacitance is substantially lower than the capacitance $C_s$ during the same half period of the clock signal but subsequent to transistor $T_d$ being rendered conductive, the capacitor $C_s$ is discharged via the additional transistor $T_b$, point A connected both the storage capacitor $C_s$ and the additional transistor $T_a$. $T_d$ may be rendered conductive prior to $T_b$ by any one of a number of known design techniques such as making the clock metallization lead to transistor $T_b$ longer than the clock metallization lead to transistor $T_d$ or by controlling parameters such as resistivity and oxide thickness. At connecting point B, there will appear the same potential. Under the given prerequisite, that $C_K$ is small compared to $C_s$, this potential will assume the following value:

$$U_B(t_2) = U_{mo} - \frac{\beta}{2}(U_n - U_m) \quad (2)$$

Prior to the discharge of the storage capacitor $C_s$ the following was applicable:

$$U_B(t_1) = U_{mo}. \quad (3)$$

Therefore, at connecting point B and, consequently, also at the coupling capacitor $C_K$, and between the two time positions $t_1$ and $t_2$ which are half a clock period apart, the potential drops by $$\beta/2 \, (U_n - U_m).$$

The other electrode of the coupling capacitor $C_K$ is connected to the drain terminal of transistor $T_{n-1}$ far from the input of the bucket-brigade circuit. At this drain terminal, therefore, the potential will drop by $$\Delta U_{n-1} = \frac{1}{2}\beta\delta(U_n - U_m). \quad (4)$$

In this equation $\delta$ indicates the capacitance relationship of the capacitances of both the bucket brigade line and the coupling capacitor $C_K$:

$$\gamma = \frac{C_K}{C + C_K}$$

Moreover, with respect to $\Delta U_{n-1}$, the following definition applies:

$$\Delta U_{n-1} = U_{n-1}^{(o)} - U_{n-1} \quad (6)$$

In this equation $U_{n-1}$ indicates the drain potential of transistor $T_{n-1}$ where the inventive regenerating circuit is not used. In cases where $n$ is a great number ($n > 10$), the following will apply by way of approximation $$\Delta U_{n-1} \approx \Delta U_n = U_n^{(o)} - U_n. \quad (7)$$

From equations (7) and (4) there will result the following relationship between the correcting quantity $\Delta U_n$ and the deviation $\Delta U_{no} = U_n^{(o)} - U_m$:

$$\frac{\Delta U_n}{\Delta U_{no}} = \frac{\beta\gamma}{2 + \beta\gamma}. \quad (8)$$

From equation (8) it will become evident that with respect to $\beta \gg 2/\delta$, the relationship will become $\Delta U_n/\Delta U_{no} \approx 1$. Thus, with a great differential gain $\beta$, the correction circuit is capable of fully compensating a d.c. level drift $\Delta U_{no}$. The common substrate into which $T_a$, $T_b$, $T_c$, $T_d$, $C_s$ and $C_K$ are diffused completes the conductive loop from $C_s$ through $C_K$ and back to $C_s$ because each device has a common junction leakage to the substrate.

Figure 2:
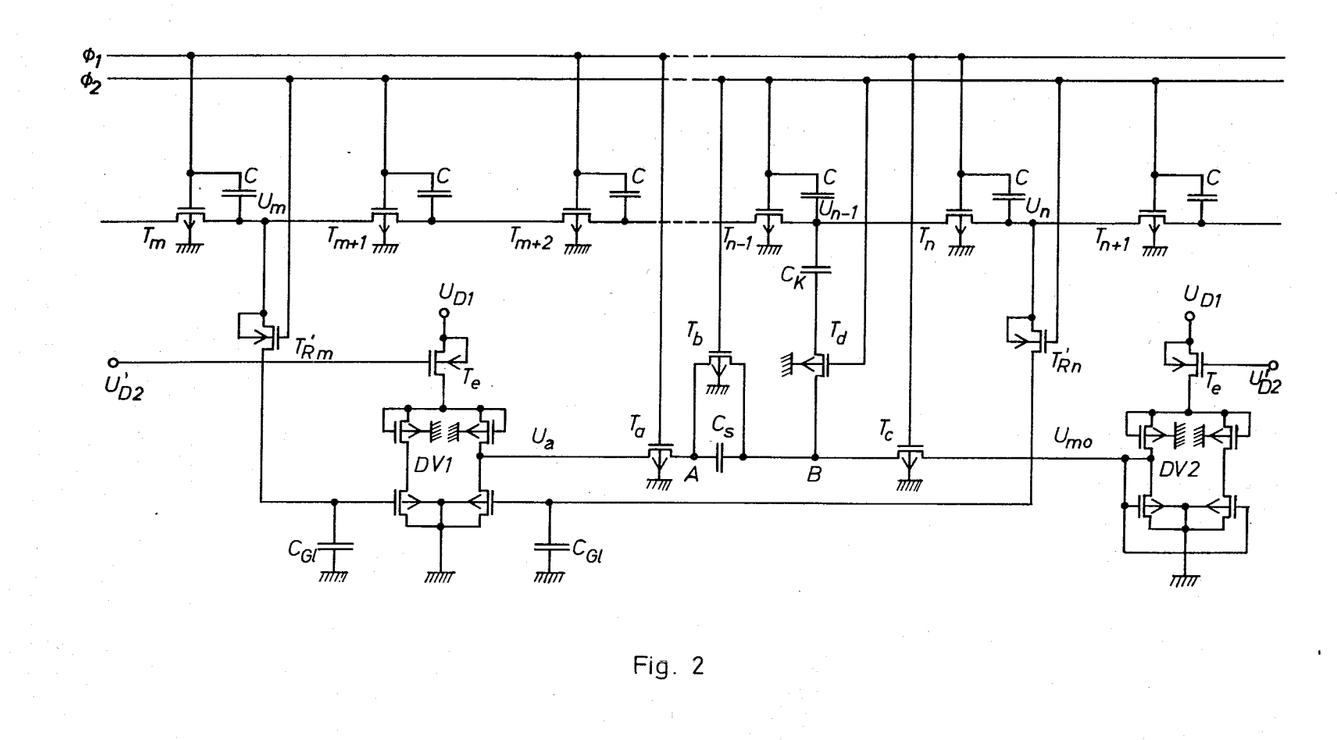
FIG. 2 shows a further embodiment of the invention bucket-brigrade circuit.

FIG. 2 shows an example of embodiment which is modified with respect to the connection of the inputs of the differential amplifier DV1. Unlike the embodiment according to FIG. 1 in which all of the employed transistors are of the same conductivity type, the embodiment shown in FIG. 2 comprises some transistors which are complementary to the transistors of the bucket-brigade circuit. In particular, the first and the second additional transistors $T'_{Rm}$, $T'_{Rn}$ via which the drain potentials of the transistors $T_m$ and $T_n$ are applied to the inputs of the differential amplifier DV1, are complementary to the transistors of the bucket-brigade circuit. Further, the constant current transistors $T_e$ of the differential amplifiers DV1 and DV2 are complementary and also arranged differently than the corresponding constant current transistors used in the embodiment of FIG. 1. In fact, they are arranged between the common terminal of the load transistors and the operating voltage $U_{D1}$, while the sources of the transistor amplifiers of the differential amplifiers DV1 and DV2 are connected to the zero point of the circuit. The constant voltage at the gate terminals of the constant current transistors $T_e$ according to FIG. 2 are coupled to the voltages $U'_{D2}$. The additional transistors $T'_{Rm}$ and $T'_{Rn}$ are in this case connected such that the substrate electrode thereof is connected to the associates drain terminal, and the gate electrode is controlled by that particular clock signal not controlling transistors $T_m$ and $T_n$. Accordingly, the additional transistors $T'_{Rm}$ and $T'_{Rn}$ according to FIG. 2 are controlled by the second clock signal $\phi_2$. The remaining circuit elements correspond to those of FIG. 1.

Figure 3:
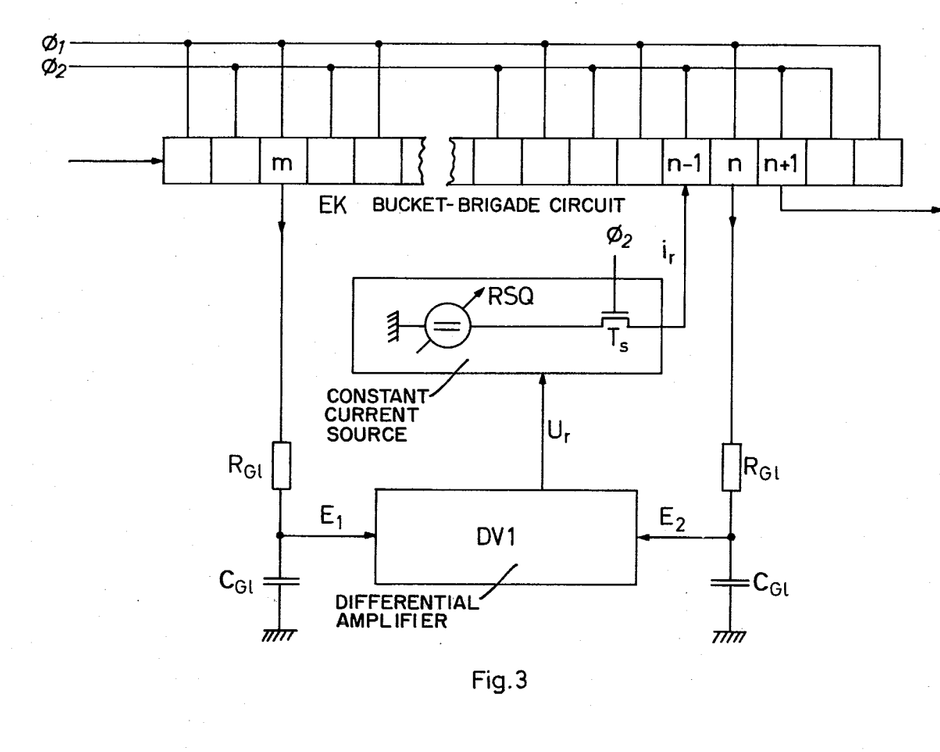
FIG. 3 is a third embodiment of the invention bucket-brigade circuit.

The upper half of FIG. 3 schematically shows again some stages of a conventional bucket-brigade circuit EK. Of the entire bucket-brigade circuit which, as is well known, may be in the order of several hundred stages, there are shown in FIG. 3 stages $m$, $n-1$, $n$ and $n+1$. In this case, the stages $m$ and $n$ are controlled by the first clock signal $\phi_1$, while the stages $n-1$ and $n+1$ are controlled by the second clock signal $\phi_2$.

The principles of regenerating the d.c. voltage level or of keeping constant the input d.c. voltage level respectively, i.e. the principle underlying the embodiments of FIGS. 3 to 6. actually reside in applying the potentials of a stage close to and of a stage far from the inputs of the bucket-brigade circuit, after having correspondingly suppressed the signal component, to the two inputs of a differential amplifier, and to apply a current pulse which is in proportion to the output signal thereof, galvanically to one of the transistors preceding the transistor far from the input of the bucket-brigade circuit, in a proper phase relation.

In the representation according to FIG. 3 the stage preceding the stage n far from the input of the bucket-brigade circuit, is the immediately preceding stage $n-1$. As the stage m close to the input, the first delaying stage of the bucket-brigade circuit is preferable at the drain terminal of which the d.c. potential still has its full rated value. The signals taken off the drain terminals of the two transistors of stages m and n are each fed across the high-ohmic resistors $R_{G1}$, to the inputs $E_1$ and $E_2$ of the differential amplifier DV1.

As high-ohmic resistors there may be used the transistors as mentioned above.

Further, the two inputs of the differential amplifier are each connected via the capacitor $C_{G1}$, to the zero point of the circuit. The resistance value of $R_{G1}$ and the capacitance of the capacitor being chosen such that the RC-combination will act as a low-pass filter for the signal frequencies to be delayed. The low-pass filter associated with the transistor close to the input of the bucket-brigade circuit may also be replaced by an adjustable d.c. biasing potential of the differential amplifier input $E_1$, thus simulating the d.c. potential at the beginning of the bucket-brigade circuit.

The two stages $m$ and $n$ at which the input signals for the differential amplifier DV1 are taken off, are both even-numbered stages controlled by the same clock signal $\phi_1$. Of course, it is also possible to use two odd-numbered stages which would be connected to clock signal $\phi_2$.

Depending on how the gate electrodes of the additional transistors serving as high-ohmic resistors, are controlled, there may be generated at the inputs of the differential amplifier either the average d.c. potential as averaged over all time intervals, or else the d.c. potential as averaged only over the drain terminal clock pulse periods of the transistors of stages m,n. The last-mentioned averaged d.c. voltage potential is naturally higher than the d.c. voltage potential as averaged over all time intervals and is thus, under certain circumstances, more suitable for effecting the forward control of the amplifier transistors of the differential amplifier DV1.

In FIG. 3, the output signal of the differential amplifier DV1 is fed to the controlled constant current source RSQ, the output current pulse $i_r$ of which is fed to the stage $n-1$ galvanically. The output of the controlled constant current source is connected galvanically via the source-drain path of the additional transistor $T_s$ to the stage $n-1$ of the bucket-brigade circuit EK. The gate terminal of the additional transistor $T_s$ is controlled by the second clock signal $\phi_2$, hence by the same clock signal which controls that particular stage to which the current pulse of the constant current source is galvanically fed.

In a good approximation, the current pulse $i_r$ supplied by the controlled constant current source, is a linear function of the regulating potential $U_r$. Moreover, with respect to a certain regulating potential $U_{ro}$, the current pulse $_r$ will become zero, with $U_{ro}$ defined in such a way that it will appear whenever no differential signal is applied to the inputs of the differential amplifier, i.e., whenever the two input potentials are alike. Finally, the polarity of the current pulse $_r$ is reversed when the regulating potential $U_r$ passes through $U_{ro}$, so that the following is applicable for a good approximation:

$$i_r = g_o (U_r - U_{ro}),$$

with $g_o$ substantially corresponding to the mutual conductance of the transistors $T_r$.

Figure 4:
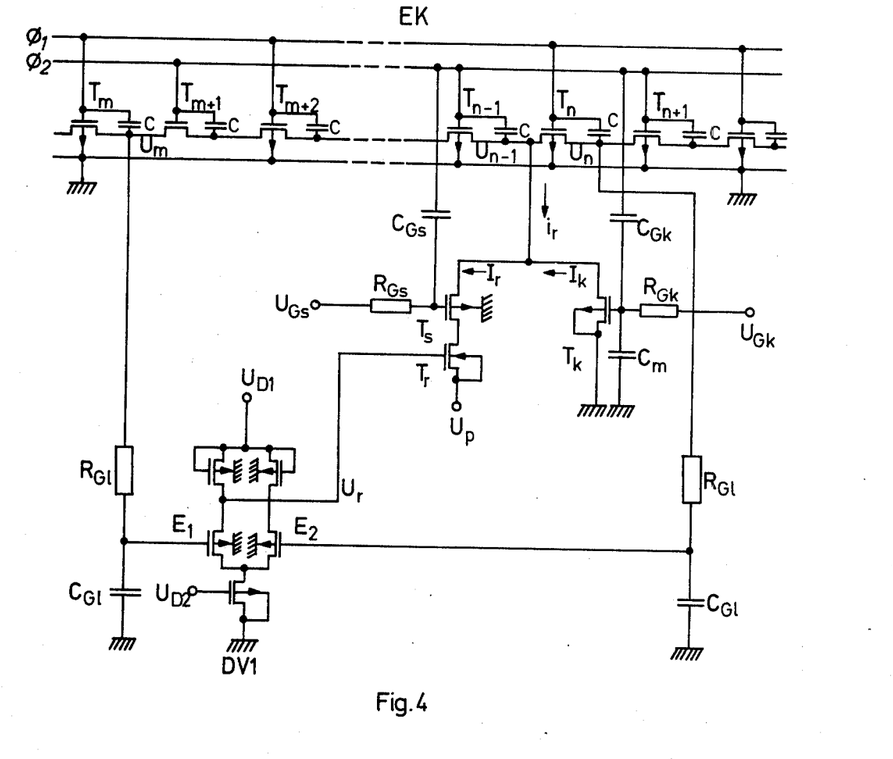
FIG. 4 is an inventive level correction circuit for use in a bucket-brigade circuit consisting of p-channel insulated-gate field-effect transistors, according to FIG. 3.

FIG. 4 shows the embodiment according to FIG. 3 composed of p-channel IGFETS. To the numbers of stages stated hereinbefore, there now correspond the transistors $T_m$, $T_{m+1}$, $T_{m+2}$, $T_{n-1}$, $T_n$ and $T_{n+1}$. These transistors are interconnected and arranged in series with the associated capacitors C in the manner described hereinbefore. The potential $U_m$ at the drain terminal of transistor $T_m$ is fed to the one input $E_1$, and the potential $U_n$ at the drain terminal of transistor $T_n$ is fed to the other input $E_2$ of the differential amplifier DV1. The difference $n-m$ does not need to be absolutely even-numbered. In cases where it is odd-numbered, and when clocked transistors operating as high-ohmic resistors $R_{G1}$ are used, care must be taken that they are controlled by the same clock signal as that particular transistor to which the resistor $R_{G1}$ is connected. This differential amplifier consists of two amplifier transistors and of two transistors connected as load resistors which, in common, are connected to the operating voltage $U_{D1}$. The source terminals of the two amplifier transistors are both connected via a constant current transistor, to the zero point of the circuit, while the gate terminal of the constant current transistor is connected to the constant voltage $U_{D2}$. The differential amplifier DV1 is of a conventional design.

The output signal of the differential amplifier DV! which is noninverted with respect to the drain potential difference $U_n-U_m$ between the transistors $T_n$ and $T_m$ is now fed as a regulating potential $U_r$ to the gate electrode of transistor $T_r$ operated in a common source circuit, which is complementary to the remaining transistors of the entire circuit (an n-channel IGFET). The source of this IGFET is applied to the negative potential $U_p$ while the drain thereof, via the additional transistor $T_s$ which, in turn, is a p-channel IGFET, is connected to the drain of transistor $T_{n-1}$ of the bucket-brigade circuit EK. The gate electrode of the additional transistor $T_s$ is connected via the capacitor $C_{Gs}$ to the second clock signal $\phi_2$, and is further applied across the high-ohmic resistor $R_{Gs}$, to the potential $U_{Gs}$. To the drain terminal of transistor $T_{n-1}$ there is connected a further p-channel IGFET $T_k$ operating in a common source circuit, with the gate terminal thereof, connected to the clock signal $\phi_2$ via capacitor $C_{Gk}$, to the zero point of the circuit via capacitor $C_m$ and, across the high-ohmic resistor $R_{Gk}$ to the d.c. potential $U_{Gk}$.

Accordingly, the transistors $T_{n-1}$, $T_s$ and $T_k$ are always rendered conductive or non-conductive at the same time. The d.c. potentials $U_{Gs}$ and $U_{Gk}$ are so dimensioned that the transistors $T_s$ and $T_K$ are rendered fully conductive or non-conductive during the corresponding semiperiods of the clock signals respectively. If so required, the transistor $T_r$ can be blocked directly by the regulating potential $U_r$ during the corresponding semiperiods.

Accordingly, the clock pulse amplitude effective at the gate terminal of the additional transistor $T_k$ is $$U_{cG} = U_c \frac{C_{Gk}}{C_{Gk} + C_m} (U_c = \text{full clock pulse amplitude})$$

Both the d.c. potential $U_{Gk}$ and the clock pulse amplitude $U_{cG}$ may be selected in such a way, for example, by suitably dimensioning the capacitances $C_{Gk}$ and $C_m$, that the current $I_k$ flowing through the transistor $T_K$ will just compensate the current flowing in the transistor $T_r$ in case $U_r = U_{ro}$, so that the regulating current pulse $i_r$ will become zero.

By selecting the other output of the differential amplifier it is possible to reverse the sign of the current pulse $i_r$.

The circuit of the controlled constant current source as shown in FIG. 4 remains completely equivalent in its function when the transistor $T_r$ is designed as a p-channel instead of as an n-channel insulated-gate field-effect transistor, when the additional transistor $T_k$ is designed as an n-channel instead of as a p-channel insulated-gate field-effect transistor, and when the potential $U_p$ as applied to the respective sources is replaced by a reference potential, and vice versa. At the same time, the transistor $T_k$ must also be controlled by the other clock signal, hence by the clock signal $\phi_2$, and the d.c. potential $U_{Gk}$ must be adapted accordingly. Further, when correspondingly changing the driving control, the additional transistor $T_s$ may be replaced by an n-channel insulated-gate field-effect transistor (IGFET).

Of course, the differential amplifier DV1 may also be designed differently. For example, the constant current transistor of the differential amplifier DV1 may be replaced by a complementary, i.e. an n-channel transistor which, in this case, must be arranged between the two load transistors and the d.c. potential $U_{D1}$. Furthermore, the two parallel-arranged inverters of the differential amplifier halves can also be replaced by two inverters designed in accordance with the complementaty IGFET technology (CMOS-inverter). All transistors of the differential amplifier may be replaced by complementary ones, and the potentials may be interchanged.

Figure 5:
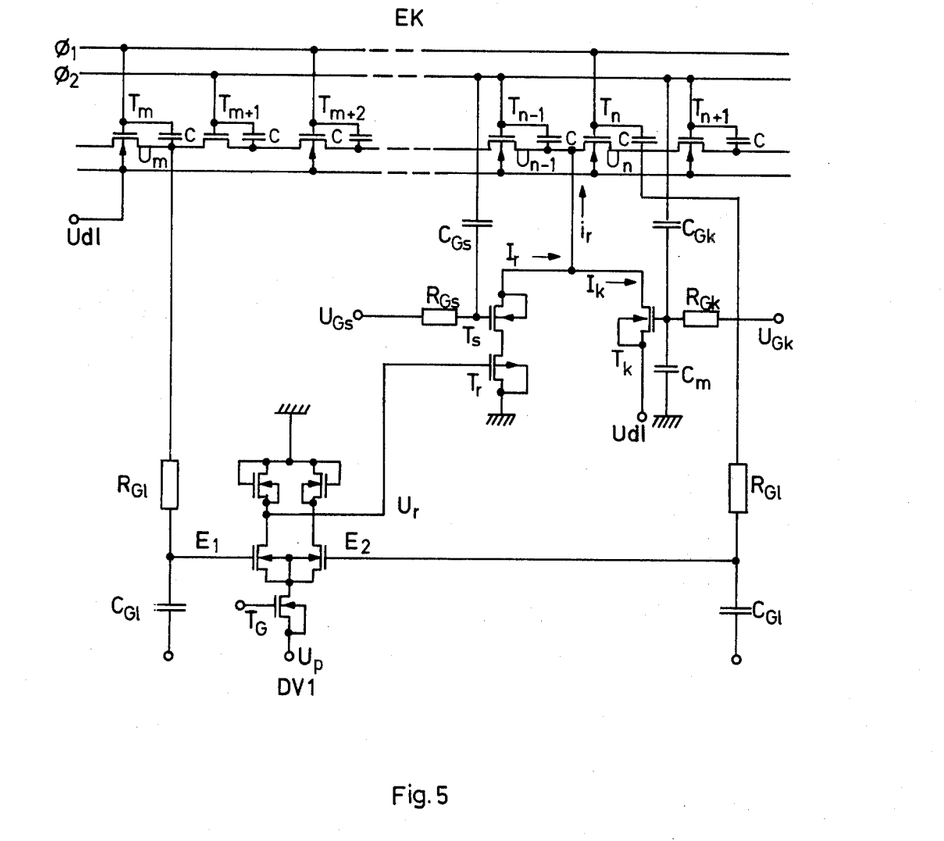
FIG. 5 is an inventive level correction circuit for use in a bucket-brigade circuit consisting of n-channel insulated-gate field-effect transistors, according to FIG. 3.

FIG. 5 shows an example of embodiment employing n-channel IGFETS which, with respect to the transistors employed is thus completely complementary to the example of embodiment according to FIG. 4. In particular, the transistor $T_r$ in FIG. 5 is a p-channel IGFET. The potential $U_{D1}$ in FIG. 5 is connected to all those points of the cicuit to which, in FIG. 4, there is applied the potential of the zero point of the circuit (except for the terminal of capacitor $C_m$ at the zero point of the circuit), while to all other points there is applied the potential of the zero point of the circuit.

Figure 6:
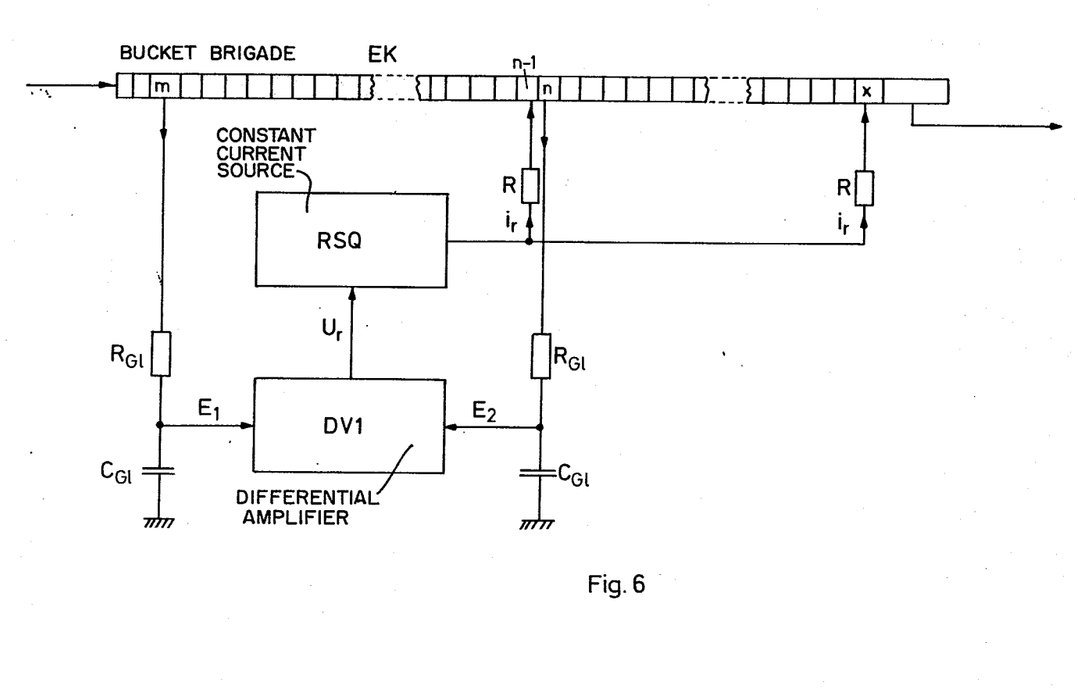
FIG. 6 shows the principle of a two-stage self-regulating level correction circuit by employing the inventive principle according to FIG. 3.

FIG. 6, finally, shows the principle of a repeated d.c. level regeneration according to the invention. To this end the regulating current pulse $i_r$ is again fed galvanically to the necessary stage $x$ lying above the stage $n-1$. Both regulating current pulses thus originate with the same controlled constant current source RSQ. In this case the source of constant current may be connected to the corresponding stages of the bucket-brigade circuit EK across decoupling resistors R.

The invention is of particular advantage especially when used in the so-called duplex operation of bucket-brigade circuits, in which two bucket-brigade circuits are operated in parallel. It was found that in each of the two parallel bucket-brigade circuits the d.c. voltage level drifts so that it is desirable to effect a d.c. voltage level compensation. This may now be accomplished with the aid of the present invention. It is to be understood that the foregoing description of specific examples of this invention is made by way of example only and is not be be considered as a limitation on its scope.

What is claimed is:

1. A bucket-brigade circuit wherein there is provided a plurality of stages which are all of the same kind, each consisting of a transistor and a capacitor coupled between the gate and drain terminal thereof, and coupled together such that the drain terminal of each transistor is connected to the source terminal of the next successive transistor, wherein the gate terminals of even numbered transistors are controlled by a first squarewave clock signal and the gate terminals of odd numbered transistors are controlled by a second squarewave clock signal of the same frequency having effective pulses lying in the intervals between effective pulses of said first clock signal comprising:
    a differential first amplifier (DV1) havin first and second inputs, said first input coupled to the drain of a first transistor ($T_m$) near the input of said bucket-brigade circuit and said second input coupled to the drain terminal of a second transistor ($T_n$) far from the input of said bucket-brigade circuit, said first and second transistors controlled by the same clock signal, said differential amplifier having first and second outputs, said first output coupled to the drain terminal of one of the transistor preceding said second transistor for applying a compensating signal.

2. A bucket-brigade circuit according to claim 1, wherein said first output of said differential amplifier is galvanically coupled to said drain terminal for applying a current pulse ($i_r$) which is proportional to said first output.

3. A bucket-brigade circuit according to claim 1, further comprising:
    third and fourth additional transistors ($T_{Rm}$ $T_{Rn}$) connected as high ohmic resistors and coupled between the first and second inputs of said differential amplifier and said first and second transistors; and first and second filter capacitors coupled between said first and second inputs of said differential amplifier and the zero point of the circuit in such a way that said first and second capacitors and said third and fourth transistors act as a low pass filter for the signal frequencies to be delayed.

4. A bucket-brigade circuit according to claim 3, wherein the gate electrodes of said third and fourth transistors are coupled to said first clock signal via third and fourth capacitors.

5. A bucket-brigade circuit according to claim 4, further including:
   a second differential amplifier (DV2), the inputs of which are coupled to one of its outputs;
   a fifth additional transistors;
   a fifth storage capacitor;
   a sixth additional transistor, said output of said first differential amplifier coupled to the output of said second differential amplifier via the source drain path of said fifth additional transistor, said fifth storage capacitor and the source drain path of said sixth additional transistor;
   a seventh additional transistor having source-drain path coupled in parallel across said fifth storage capacitor;
   an eighth additional transistor; and
   a sixth coupling capacitor, the junction between said fifth capacitor and the source of said sixth additional transistor coupled to the drain of the transistor immediately preceding said second transistor via the series arrangement of the source-drain path of said eighth additional transistor and of said sixth coupling capacitor, the gate terminals of said fifth and sixth additional transistors coupled to said first clock signal and the gate terminals of said seventh and eighth transistors coupled to said second clock signal.

6. A bucket-brigade circuit according to claim 1, further comprising:
   third and fourth complementary transistors, each having a source electrode coupled to the associated substrate and a gate electrode coupled to the clock signal not controlling said first and second transistors, the drain terminals of said first and second transistors coupled to said first and second input of said second differential amplifier via said third and fourth transistors; and
   a first filter capacitor coupled between the inputs of said differential amplifier and the zero point of the circuit such that the third and fourth additional transistors and said first filter capacitor act as a low pass filter for the signal frequencies which are to be delayed.

7. A bucket-brigade circuit according to claim 6, further comprising:
   a second differential amplifier (DV2), the inputs of which are coupled to one of its outputs;
   a fifth additional transistor;
   a second storage capacitor;
   a sixth additional transistor, said output of said differential amplifier coupled to the output of said second differential amplifier via said second storage capacitor and the source-drain path of said sixth additional transistor;
   a seventh additional transistor having a source-drain path coupled in parallel across said second storage capacitor;
   an eighth additional transistor; and
   a third coupling capacitor, the junction between said second capacitor and the source of said sixth additional transistor coupled to the drain of the transistor immediately preceding said second transistor via the series arrangement of the source-drain path of said eighth additional transistor and of said third coupling capacitor, the gate terminals of said fifth and sixth additional transistors coupled to said second clock signal and the gate terminals of said seventh and eighth transistors coupled to said first clock signal.

8. A bucket-brigade circuit according to claim 7, further comprising:
   a complementary constant current transistor inserted between the transistors of said first differential amplifier and the operating voltage, the sources of said amplifying transistors coupled to the zero point of the circuit.

9. A bucket-brigade circuit according to claim 2, wherein said current pulse ($i_r$) is generated by a source of constant current controlled by the output of said differential amplifier.

10. A bucket-brigade circuit according to claim 9, wherein said current pulse is galvanically fed to the drain of the transistor directly preceding said second transistor.

11. A bucket-brigade circuit according to claim 10, wherein the output of differential amplifier is coupled to the input of said constant current source and that the output of said constant current source is coupled to the drain terminal of the transistor which immediately precedes said second transistor.

12. A bucket-brigade circuit according to claim 11, wherein said current pulse equals zero whenever the first and second inputs of said differential amplifier are equivalent.

13. A bucket-brigade circuit according to claim 12, wherein all transistors are integrated insulated gate field effect transistors of the enhancement type.

14. A bucket-brigade circuit according to claim 12, wherein all transistors are integrated insulated gate field effect transistors of the depletion type.

* * * * *